(12) United States Patent
Zhang et al.

(10) Patent No.: US 6,319,028 B1
(45) Date of Patent: Nov. 20, 2001

(54) ELECTRICAL CONNECTOR EQUIPPED WITH AN IMPROVED EJECTOR MECHANISM

(75) Inventors: JianQiang Zhang; ZhengHua Xu, both of KunSan (CN); Duan Zheng Xu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/695,485

(22) Filed: Oct. 23, 2000

(30) Foreign Application Priority Data

Jun. 17, 2000 (TW) ................................................ 089210372

(51) Int. Cl.[7] ............................. H01R 13/62; H01R 9/22; H01R 13/73

(52) U.S. Cl. ............................................ 439/159; 439/923

(58) Field of Search ................................... 439/159, 160, 439/158, 157, 156, 155, 154, 153, 152, 541.5, 923

(56) References Cited

U.S. PATENT DOCUMENTS

| | | | |
|---|---|---|---|
| 5,730,610 | * 3/1998 | Hsia et al. | 439/160 |
| 5,984,702 | * 11/1999 | Nishioka | 439/159 |
| 5,993,227 | * 11/1999 | Hsia et al. | 439/159 |
| 6,065,984 | * 5/2000 | Tung | 439/159 |
| 6,095,835 | * 8/2000 | Oguchi | 439/159 |
| 6,155,853 | * 12/2000 | Kajiura | 439/159 |

* cited by examiner

Primary Examiner—Tulsidas Patel
Assistant Examiner—Chandrika Prasad
(74) Attorney, Agent, or Firm—Wei Te Chung (57) ABSTRACT

An electrical connector (1) adapted for providing an interconnection between an electronic card (2) and a printed circuit board includes an insulative housing (10), a plurality of electrical contacts (12) received in the insulative housing and an ejector mechanism mounted in one side of the insulative housing. The ejector mechanism has a push-rod (136) pushed outwardly by two first spring elements (130), a push block (131) pushed outwardly by a second spring element (142) and an actuator (143) for locking the push-rod in a card-engaged position. An inward acting force against the push block unlocks the actuator and releases the push-rod to eject an inserted card.

15 Claims, 8 Drawing Sheets

ELECTRICAL CONNECTOR EQUIPPED WITH AN IMPROVED EJECTOR MECHANISM

FIELD OF THE INVENTION

The present invention relates to an electrical connector for providing an interconnection between electronic card and a printed circuit board, and particularly to an electrical connector having an ejector mechanism.

BACKGROUND OF THE INVENTION

Figure 8:
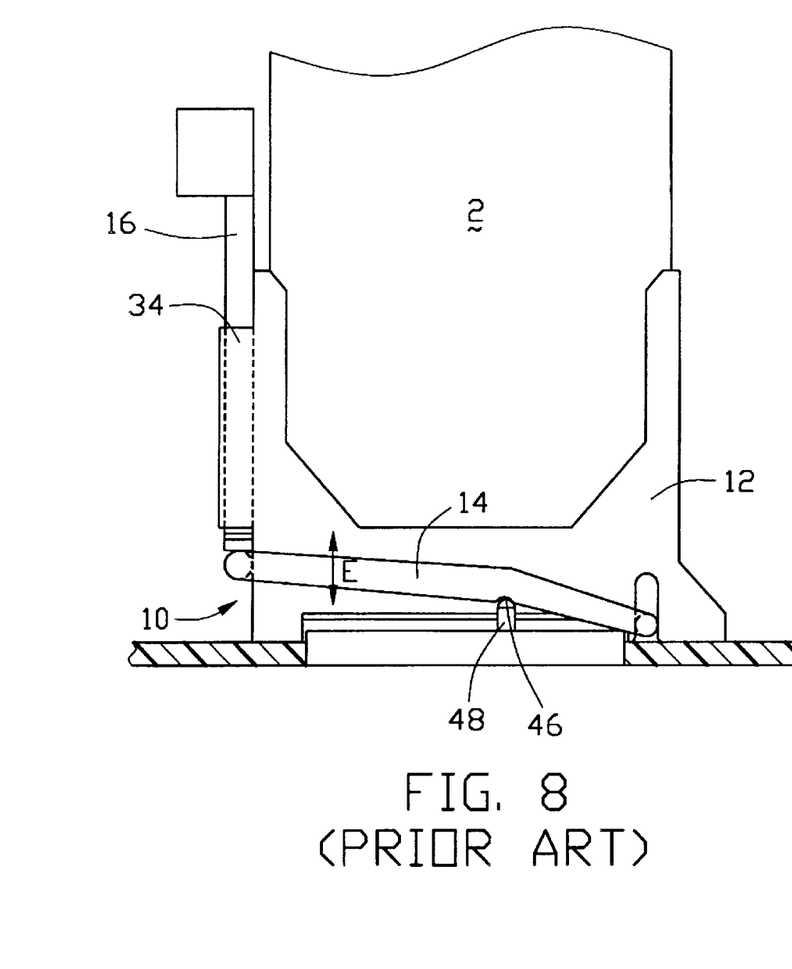
FIG. 8 is a top view of a conventional connector.

Conventional electrical connectors generally have ejector mechanisms utilizing the operating principle of a lever. Such a conventional connector is, for example, disclosed in U.S. Pat. No. Re. 35938. Referring to FIG. 8, an electrical connector has a housing 12 for receiving an electronic card 2 therein and an ejector mechanism 10. The ejector mechanism 10 includes a one-piece eject lever 14 and a one-piece actuator 16. The eject lever 14 is transversely and pivotally mounted in the housing 12 for ejecting the card 2 out of the housing 12. A pair of pivot bosses 48 projects from a rear wall of the connector to engage a pair of pivot recess 46 defined on two sides of the eject lever 14, whereby the eject lever 14 can pivot in the direction of double-headed arrow "E". The actuator 16 is longitudinally and movably mounted within an integrally molded channel 34 in the housing 12 and is engageable with the eject lever 14 for manual actuation thereof The arrangement of the pivot bosses 48 and the transverse eject lever 14 occupies much space within the connector, resulting in the connector having a relatively large size. This design goes against the trend in electronic devices toward miniaturization. Furthermore, the ejector mechanism 10 requires precise cooperation between the actuator 16 and the channel 34 and therefore requires high manufacture precision, thereby making the manufacture more complicated.

This invention is directed to solving the above problems and satisfying the need for a very simple and easily operated ejecting system.

BRIEF SUMMARY OF THE INVENTION

A main object, therefore, of the present invention is to provide an improved ejector system for ejecting an electronic card easily.

Another object is to provide a simple ejector mechanism, which occupies a small space and simplifies the manufacture of the electrical connector used with it.

An electrical connector in accordance with the present invention comprises an insulative housing, a plurality of electrical contacts received in the insulative housing and an ejector mechanism mounted in one side of the insulative housing. The ejector mechanism includes a push-rod movably received in the housing, a spring element, a push block movably mounted in the housing adjacent to the push-rod and an actuator movably mounted in the housing between the push-rod and push block. The spring element is received in the housing for providing a pushing force on the card received in the housing. When the card is inserted into the connector, the push-rod is pushed by the card to move forwardly and compresses the spring element, and the actuator abuts against the push-rod; when an external force is exerted on the push block, the actuator is pushed by the push block and disengages from the push-rod, and the spring element is released to drive the push-rod to eject the card.

Other objects, advantages and novel features of the invention will become more apparent from the following detailed description when taken in conjunction with the accompanying drawings.

DETAILED DESCRIPTION OF THE INVENTION

Figure 1:
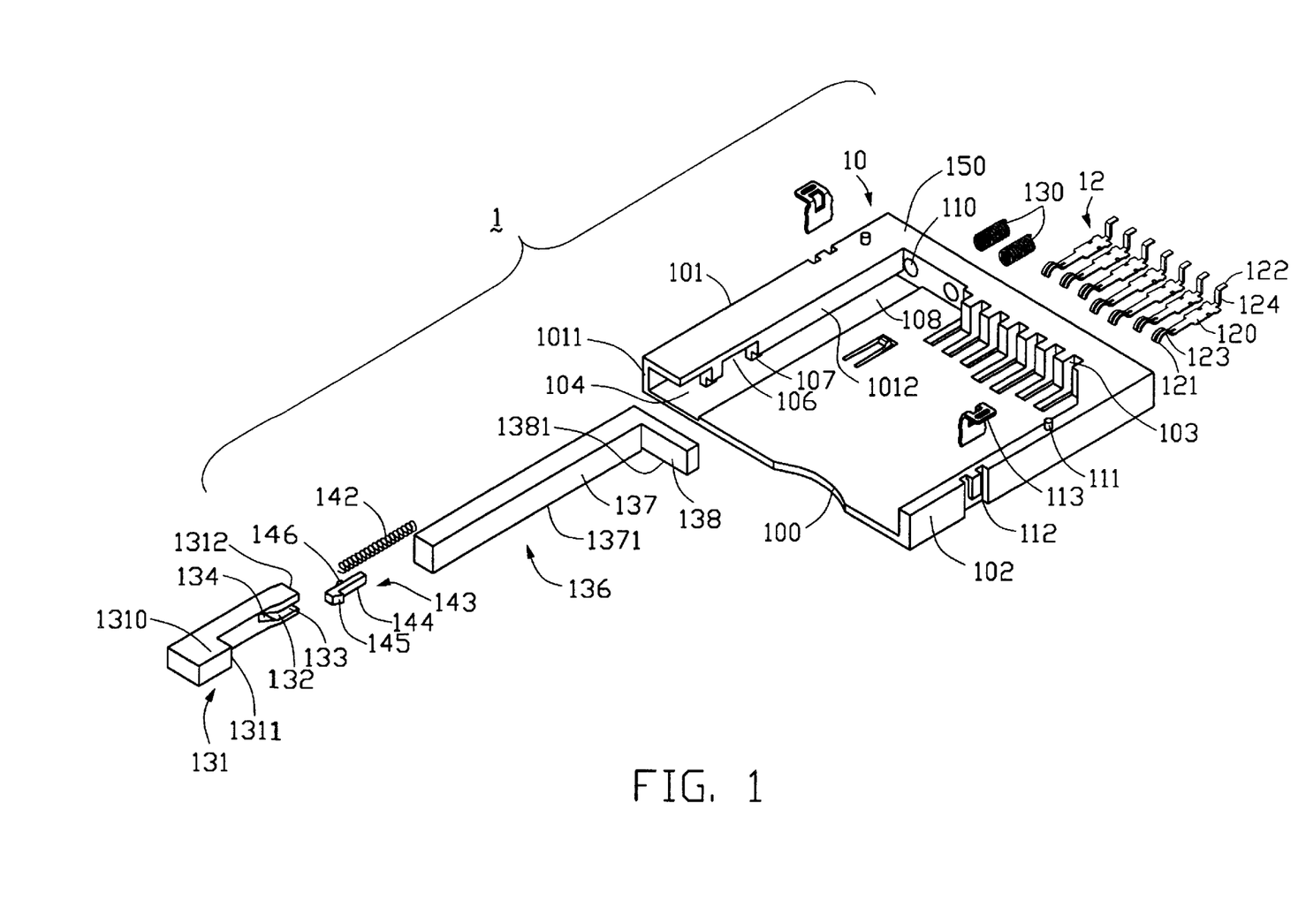
FIG. 1 is an exploded view of an electrical connector of the present invention.
Figure 2:
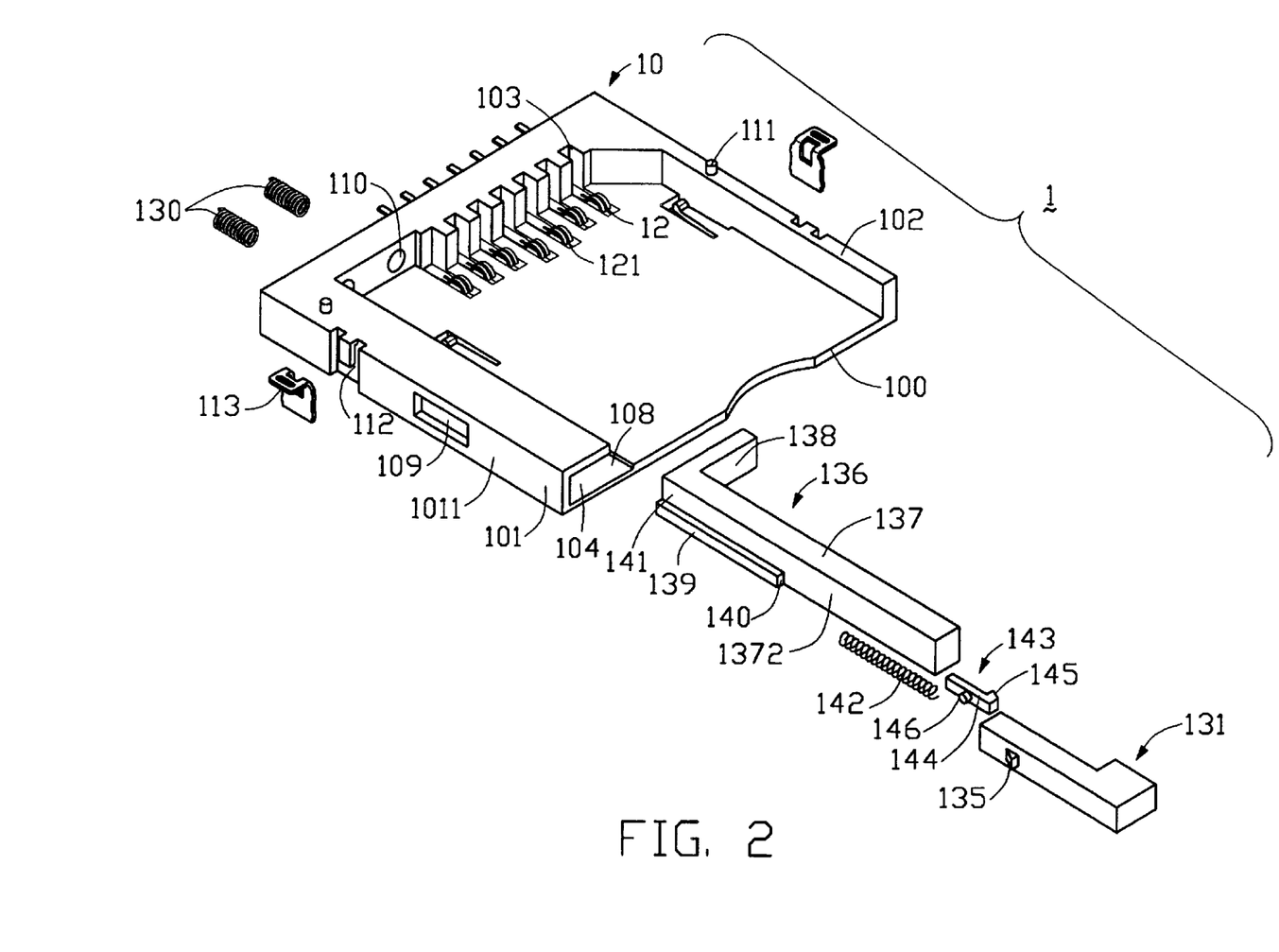
FIG. 2 is the electrical connector of FIG. 1 viewed from another aspect.
Figure 3:
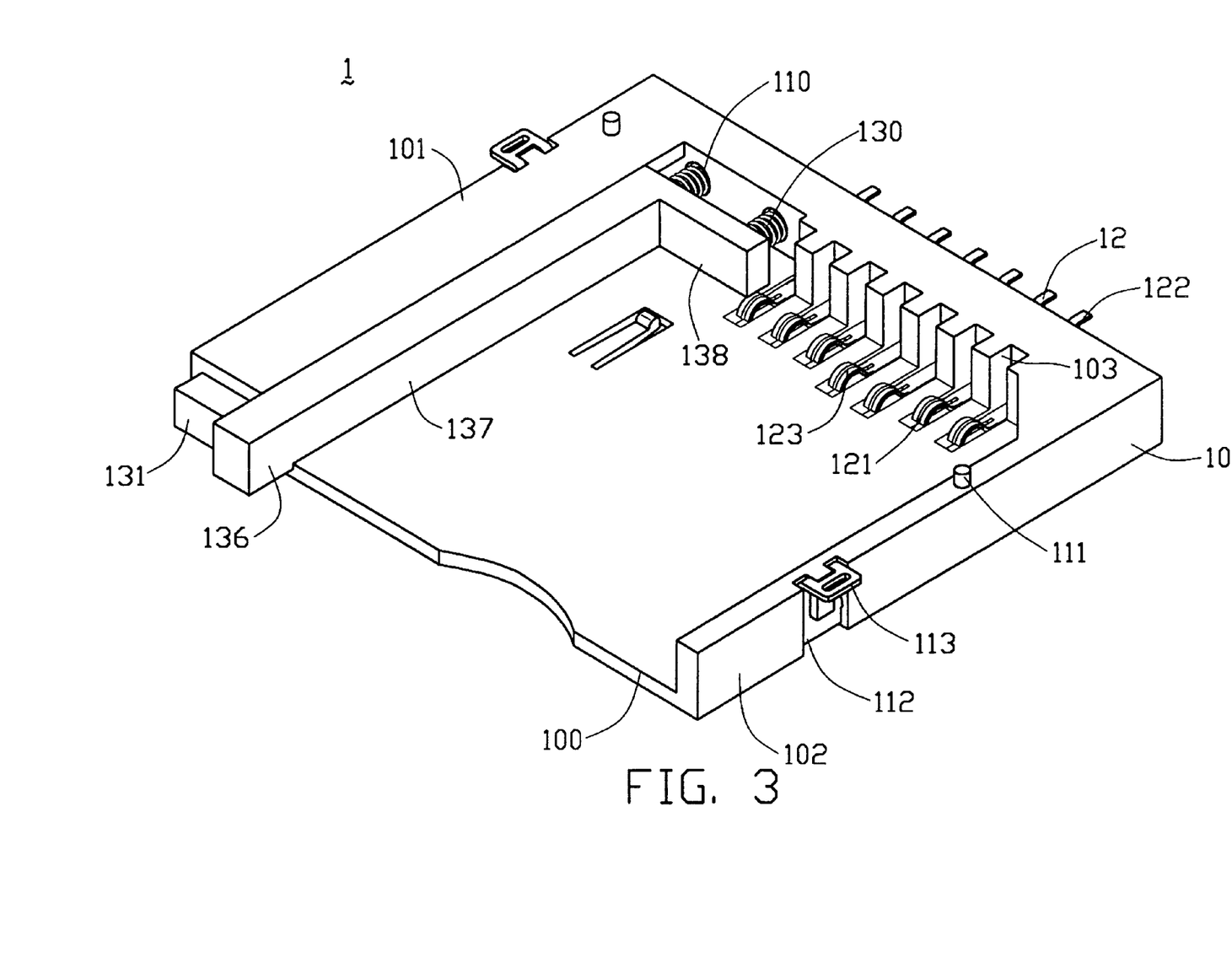
FIG. 3 is an assembled view of FIG. 1.

Referring to FIGS. 1, 2 and 3, an electrical connector 1 according to the present invention comprises an insulative housing 10, a plurality of electrical terminals 12 received in the housing 10 and an ejector mechanism mounted in one side of the housing 10.

Figure 4:
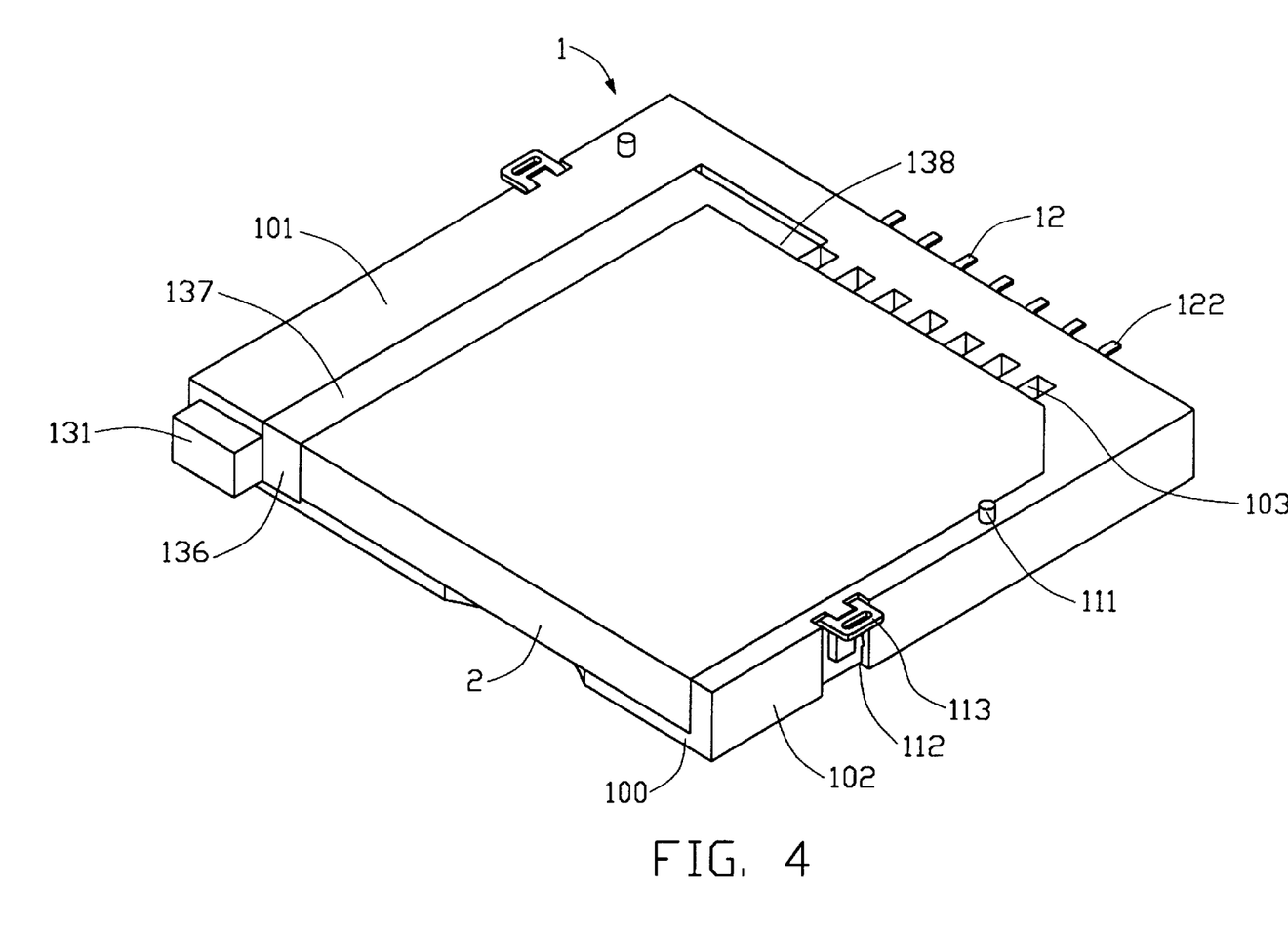
FIG. 4 is a perspective view of an electronic card being assembled in the connector.
Figure 5:
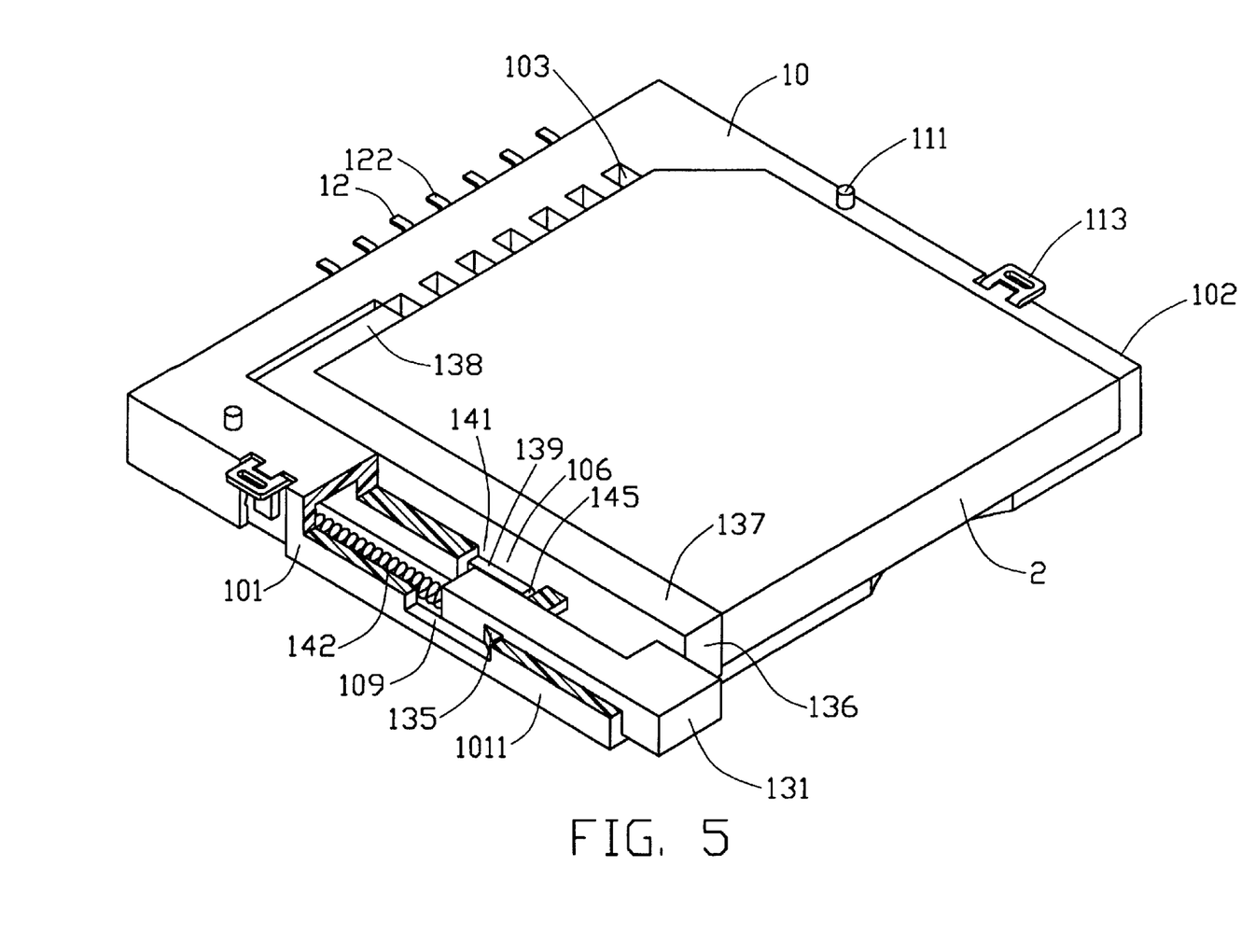
FIG. 5 is a view similar to FIG. 4, but being partially cut away to show the assembly of a spring element in a housing of the connector.

The insulative housing 10 comprises a base 100, a first and a second sidewalls 101, 102 and a front wall 150 connected between the first and second sidewalls 101, 102. A receiving space (not labeled) is defined between the base 100, first and second sidewalls 101, 102, and front wall 150 for receiving an electronic card 2 (shown in FIG. 4). The first and second sidewalls 101, 102 respectively protrude from opposite sides of the base 100. A plurality of passageways 103 for receiving terminals 12 therein is defined through a front portion of the base 100 and longitudinally extends into a rear portion of the front wall 150.

The first sidewall 101 forms an outer wall 1011 and a top wall (not labeled) substantially perpendicular to each other. A receiving cavity 104 is defined in the first sidewall 101 in communication with the receiving space (not labeled). An inner wall 1012 depends downwardly from an inner edge of a front part of the top wall and opposite to the outer wall 1011. The inner wall 1012 transversely defines a notch 106. A recess 107 is defined through a lower corner of the inner wall 1012, and is exposed to the receiving cavity 104 and the receiving space (not labeled). A trough 108 is defined in the base 100 close to the sidewall 101 and is in communication with the receiving cavity 104. A rectangular opening 109 is defined in the outer wall 1011 and communicates with the receiving cavity 104. A cutout 112 is defined in an outer surface of each of the first and the second sidewalls 101,102 for receiving a solder pad 113 therein. A pair of holes 110 is juxtaposed in a rearward surface of the front wall 150. Two posts 111 respectively project upwardly from the top wall (not labeled) of the first sidewall 101 and a top surface (not labeled) of the second sidewall 102 for positioning the connector 1 on a printed circuit board (not shown).

Particularly referring to FIG. 1, each electrical terminal 12 comprises a planar portion 120 for fixing the terminal in the housing 10, a contact portion 121 rearwardly extending from an end of the planar portion 120 and a soldering pad 122 formed at an opposite end of the planar portion 120. The contact portion 121 has an arcuate protrusion 123 adjacent a free end thereof for electrically connecting with complementary contacts of the electronic card 2. The soldering pad 122 is parallel with the planar portion 120. An upright portion 124 connects the soldering pad 122 with the planar portion 120.

The ejector mechanism includes a pair of first spring elements 130, a push block 131, a push-rod 136, a second spring element 142 and an actuator 143. In this embodiment of the present invention, both the pair of first spring elements 130 and the second spring element 142 are compression springs. The push block 131 forms a wedge 135 on one side thereof (see FIG. 2) and forms a protrusion 1310 on a second opposite side thereof. A stop face 1311 is formed on a forward surface of the protrusion 1310. A slide slot 132 is defined in the second side of the push block 131 for receiving the actuator 143. The slide slot 132 comprises a straight groove 133 horizontally extending from a forward end 1312 of the push block 131 and an inclined groove 134 obliquely continuing from the straight groove 133 and extending rearwardly and upwardly. The push-rod 136 includes a first arm 138 and a second arm 137 extending perpendicular to the first arm 138. A bottom surface 1371 of the second arm 137 is substantially lower than a bottom surface 1381 of the first arm 138. A rib 139 is formed on an outward side 1372 of the second arm 137 and opposite to the first arm 138. The rib 139 has an end 140 for engaging with the actuator 143 and the stop face 1311 of the push block 131. A guiding channel 141 is defined between a top surface of the rib 139 and the outward side 1372 of the second arm 137. The actuator 143 includes an elongated main body 144, a hook 145 laterally extending from a rear end of an inner side of the main body 144, and a circular protrusion 146 formed on an outer side of the main body 144 opposite to the hook 145.

In assembly, referring to FIG. 3, the first spring elements 130 are partly received in the corresponding holes 110 of the housing 10. The second spring element 142 is received in the receiving cavity 104 of the first sidewall 101 and has an end abutting the rear of the front wall 150. Then the push block 131 is inserted into the receiving cavity 104 and has its forward end 1312 contacting with the second spring element 142. The actuator 143 is movably upwardly and downwardly received in the notch 106, and the protrusion 146 of the actuator 143 is movably forwardly and rearwardly received in the inclined groove 134 of the push block 131. The push-rod 136 is inserted into the housing 10, and the second arm 137 thereof is received in the trough 108 of the base 100 with its outward side 1372 abutting the inner wall 1012. The rib 139 of the pushrod 136 is slidably received in the recess 107 of the inner wall 1012. The first arm 138 extends over the base 100 with a bottom surface 1381 thereof touching a top surface of the base 100.

In the initial state, shown in FIG. 3, the first spring elements 130 and the second spring element 142 are slightly compressed. The hook 145 of the actuator 143 is received in the guiding channel 141 of the pushrod 136 and is confined in an upper part of the notch 106 of the inner wall 1012 by the rib 139. With the urging force applied to the push block 131 by the second spring element 142, the actuator 143 is under a force from the inclined groove 134 urging it to abut downwardly against the rib 139. The end 140 of the rib 139 of the push-rod 136 abuts against the stop face 1311 of the push block 131, thereby preventing the push-rod 136 from being pushed completely out of the connector 1 by the first spring elements 130. The protrusion 146 is locked in the inclined groove 134, resisting a combined pushing force produced by the first and the second spring elements 130 and 142. The wedge 135 of the push block 131 is received in the opening 109 of the first sidewall 101, but does not engage with the rearward side of the opening 109 (see FIG. 7 for approximation).

Referring to FIGS. 1, 2, 4 and 5, when the electronic card 2 is inserted into the connector 1, a front edge (not labeled) of the card 2 pushes the first arm 138 of the push-rod 136 and drives the push-rod 136 to move forwardly. At the same time, the first arm 138 of the push-rod 136 compresses the first spring elements 130. The second spring element 142 tends to push the push block 131 to move rearwardly and, once the rib 139 moves forward from beneath the hook 145, the downward acting force exerted on the actuator 143 by the push block 131 pushes the actuator 143 to move downwardly in the notch 106 from the guiding channel 141 until the hook 145 engages with the end 140 of the rib 139 to lock the push-rod 136 at the position shown in FIG. 4. This position can be called a card-inserted position. At the same time, the protrusion 146 of the actuator 143 moves along the inclined groove 134, through a junction of the inclined groove 134 and the straight groove 133, to approximately the free end of the straight groove 133. The wedge 135 of the push block 131 now abuts against the rear end of the opening 109 that serves as a rearmost limit position of the push block 131. The wedge 135, therefore, prevents the push block 131 from being pushed completely out of the housing 10. Therefore the electronic card 2 is reliably received in the connector 1.

Figure 6:
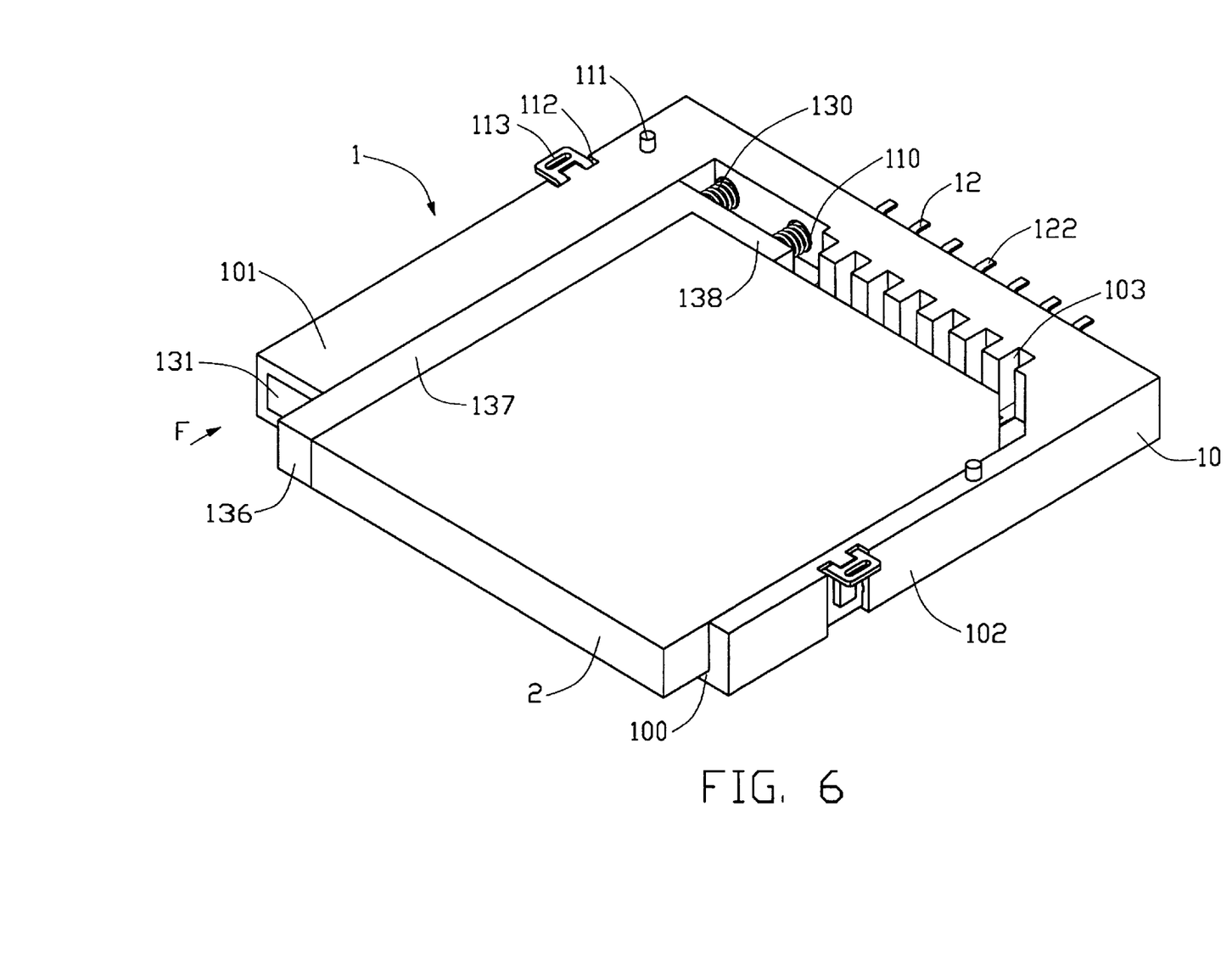
FIG. 6 is a perspective view of the card being ejected from the connector at a first stage.
Figure 7:
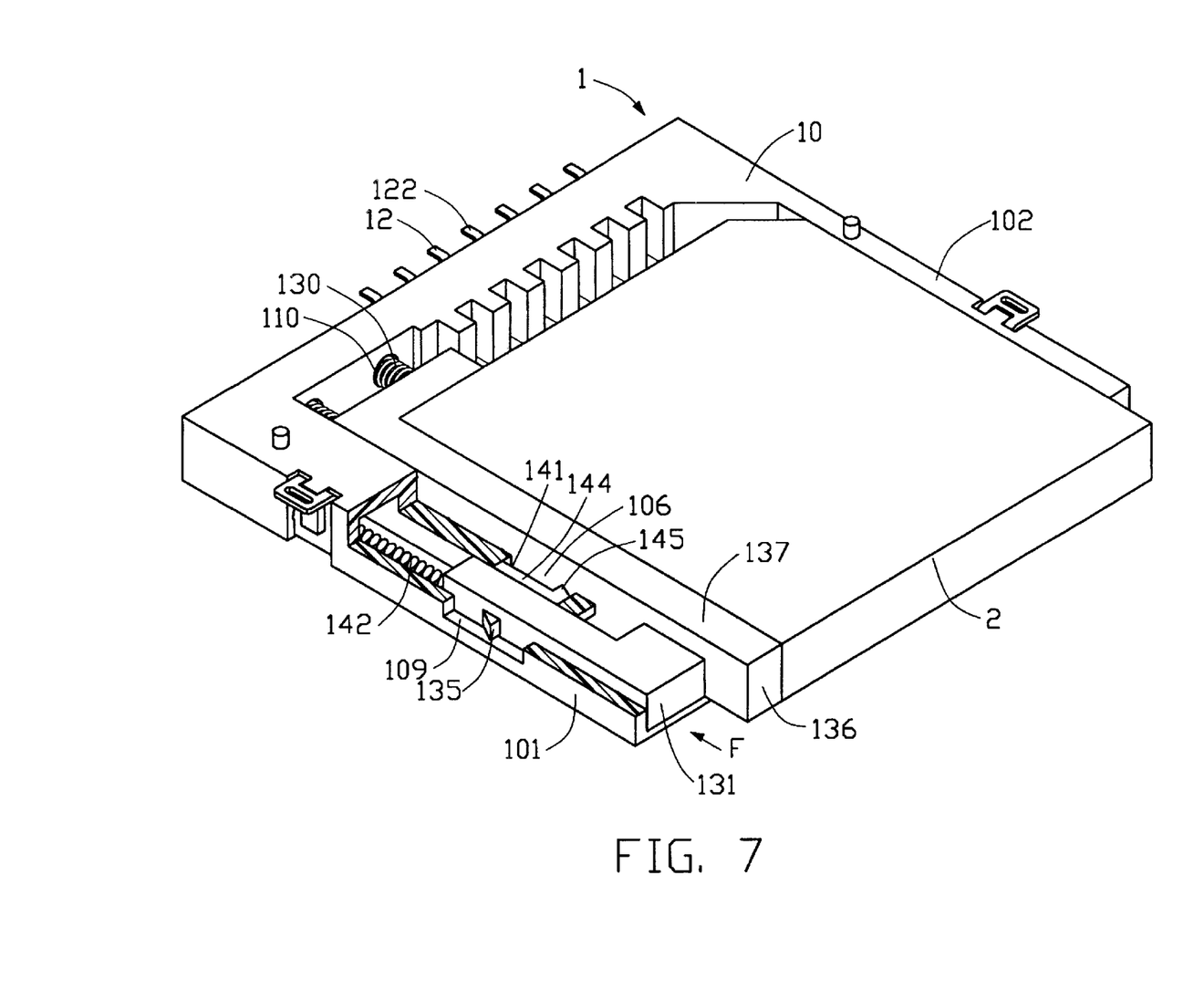
FIG. 7 is a perspective view of the card being ejected from the connector at a second stage, the connector being partially cut away to show the engagement of the spring element with the housing of the connector.

Referring to FIGS. 6 and 7, when an external force is exerted on the push block 131 in the direction of the arrow F (shown in FIG. 6), the push block 131 moves forwardly in the receiving cavity 104, the wedge 135 moving forwardly along the opening 109, and the push block 131 compresses the second spring element 142. During this forward motion of the push block 131, the protrusion 146 is forced to move rearward in the slide slot 132, passing the junction of the inclined groove 134 and the straight groove 133 and moving rearward, uppermost to the end of the inclined groove 134. As the actuator 143 correspondingly moves upward in the notch 106, the hook 145 of the actuator 143 disengages from the end 140 of the rib 139 and is received in the guiding channel 141. With the hook 145 being clear of the way, the first spring elements 130 urge the push-rod 136 to move rearwardly along the trough 108 of the housing. Thus the electronic card 2 is ejected out of the connector 1. When the external force is removed, the second spring element 142 is released and the ejector mechanism automatically comes back to the initial state as shown in FIG. 3.

The external force is only required to urge the hook 145 of the actuator 143 to disengage from the end 140 of the rib 139. It is the force automatically produced by the compressed the first spring elements 130 that ejects the card outward. Thus, the operation is more labor-saving than those of conventional ejector mechanisms.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for interconnecting an electronic card with a printed circuit board, comprising:
   an insulative housing;
   a plurality of electrical contacts received in the insulative housing; and
   an ejector mechanism mounted on the housing and including:
      a push-rod movably received in the housing;
      one or more first spring elements received in the housing for exerting a force on the push-rod;
      a push block movably mounted in the housing adjacent to the push-rod;
      at least a second spring element for exerting a force on the push block; and
      an actuator being movably mounted in the housing between the push-rod and the push block and being driven by the push block to be in a first position, in which the actuator locks the push-rod in a card-inserted position thereby preventing the push-rod from ejecting the inserted card, and a second position in which the actuator is disengaged from the push-rod, allowing the push-rod to eject the inserted card under the force of the first spring element.

2. The electrical connector as claimed in claim 1, wherein at the first position, the actuator is drivable by the push block to disengage from the push-rod, thereby permitting the first spring element to push the push-rod to eject the card.

3. The electrical connector as claimed in claim 1, wherein both of the first spring element and the second spring element are springs.

4. The electrical connector as claimed in claim 1, wherein a receiving cavity is defined in a sidewall of the insulative housing for receiving the push block and the second spring element.

5. The electrical connector as claim 4, wherein an inner wall depends downwardly from an edge of the sidewall of the insulative housing and defines a notch transversely therethrough and a recess on an inner corner thereof.

6. The electrical connector as claimed in claim 1, wherein the push-rod includes a first arm and a second arm extending perpendicular to the first arm, a rib being formed on a side of the second arm opposite to the first arm.

7. The electrical connector as claimed in claim 6, the bottom surface of the second arm is lower than the bottom surface of the first arm.

8. The electrical connector as claimed in claim 1, wherein the actuator includes an elongated main body, a hook laterally extending from the main body, and a circular protrusion formed on the main body opposite to the hook.

9. The electrical connector as claimed in claim 8, wherein a slide slot is defined in a side of the push block for receiving the circular protrusion of the actuator.

10. The electrical connector as claimed in claim 9, wherein the slide slot includes a straight groove horizontally extending from a forward end of the push block and an inclined groove obliquely continuing from the straight groove and extending rearwardly and upwardly.

11. The electrical connector as claimed in claim 1, wherein the insulative housing has a side opening and a wedge is formed on one side of the push block to be slidably received in the opening.

12. An ejection mechanism for use with an electronic card, comprising:
   an insulative housing;
   a push-rod moveable in a front-to-back direction in the housing;
   first spring means urging the push-rod to move rearwardly;
   a push block movable mounted in the housing along the front-to-back direction adjacent to the push-rod;
   second spring means urging the push block to move rearwardly; and
   an actuator movably mounted in the housing in a vertical direction perpendicular to said front-to-back direction; wherein
   when said actuator is in a first position, the push-rod is adapted to freely move along said front-to-back direction for insertion or ejection of the card, while when said actuator is in a second position, the push-rod is locked by said actuator with the card inserted therein.

13. The mechanism as claimed in claim 12, wherein when said actuator is in a second position, by pressing the push block forwardly and successively moving the actuator, said push-rod can be unlocked from the actuator and urged by the first spring means to move rearwardly for ejecting the card therefrom.

14. An ejection mechanism for use with an electronic card, comprising:
   an insulative housing;
   a push-rod moveable in a front-to-back direction in the housing with front and rear positions along said front-to-back direction;
   first spring means urging the push-rod to move rearwardly;
   a push block movable mounted in the housing along the front-to-back direction adjacent to the push-rod with forward and rearward positions along said front-to-back direction;
   second spring means urging the push block to move rearwardly; and
   an actuator movably mounted in the housing between locking and unlocking positions;
   the push-rod, the push block and the actuator being characterized in that when the push-rod is in the front position, the actuator is in the locking position to prevent the push-rod from moving rearward by said first spring means for retaining the card in the housing, and the push block is in the rearward position;
   when the push-rod is in the rear position, the actuator is in the unlocking position for allowing for insertion of the card into the housing, and the push block is in the rearward position; and
   when the push-rod is intended to move from the front position to the rear position to eject the inserted card, the push block is moved from the rearward position to the forward position thereby actuating the actuator to move from the locking position to the unlocking position and successively resulting in rearward movement of the push-rod due to resilient force of the first spring means.

15. The mechanism as claimed in claim 14, wherein said actuator is moved in a vertical direction perpendicular to said front-to-back direction.

* * * * *